US010879671B1

(12) United States Patent
Deppe

(10) Patent No.: US 10,879,671 B1
(45) Date of Patent: Dec. 29, 2020

(54) VERTICAL-CAVITY SURFACE-EMITTING DEVICE WITH EPITAXIAL INDEX GUIDE

(71) Applicant: sdPhotonics LLC, Richardson, TX (US)

(72) Inventor: Dennis G. Deppe, Richardson, TX (US)

(73) Assignee: sdPhotonics LLC, Richardson, TX (US)

( * ) Notice: Subject to any disclaimer, the term of this patent is extended or adjusted under 35 U.S.C. 154(b) by 0 days.

(21) Appl. No.: 16/537,139

(22) Filed: Aug. 9, 2019

Related U.S. Application Data

(63) Continuation of application No. PCT/US2018/018350, filed on Feb. 15, 2018.

(60) Provisional application No. 62/459,078, filed on Feb. 15, 2017.

(51) Int. Cl.
*H01S 5/00* (2006.01)
*H01S 5/183* (2006.01)
*H01S 5/187* (2006.01)
*H01S 5/20* (2006.01)

(52) U.S. Cl.
CPC .......... *H01S 5/18333* (2013.01); *H01S 5/183* (2013.01); *H01S 5/187* (2013.01); *H01S 5/1833* (2013.01); *H01S 5/18308* (2013.01); *H01S 5/18327* (2013.01); *H01S 5/18358* (2013.01); *H01S 5/2018* (2013.01); *H01S 5/2059* (2013.01); *H01S 5/2072* (2013.01)

(58) Field of Classification Search
CPC .. H01S 5/18327; H01S 5/18358; H01S 5/183; H01S 5/18308; H01S 5/1833; H01S 5/18333; H01S 5/187; H01S 5/2018; H01S 5/2059; H01S 5/2072
See application file for complete search history.

(56) References Cited

U.S. PATENT DOCUMENTS

| 6,556,610 B1 | 4/2003 | Jiang et al. |
| 6,906,353 B1 | 6/2005 | Shieh et al. |
| 2002/0117675 A1* | 8/2002 | Mascarenhas ........ H01L 29/227 257/87 |
| 2003/0039294 A1* | 2/2003 | Ueki ................... H01S 5/18394 372/96 |

(Continued)

FOREIGN PATENT DOCUMENTS

| KR | 10-0475846 B1 | 3/2003 |
| KR | 10-0536417 B1 | 3/2006 |

*Primary Examiner* — Kinam Park
(74) *Attorney, Agent, or Firm* — Taboada Law Firm, PLLC; John M. Taboada

(57) ABSTRACT

A semiconductor vertical resonant cavity light source includes an upper and lower mirror that define a vertical resonant cavity. An active region is within the cavity for light generation between the upper and lower mirror. At least one cavity spacer region is between the active region and the upper mirror or lower mirror. The cavity includes an inner mode confinement region and an outer current blocking region. An index guide in the inner mode confinement region is between the cavity spacer region and the upper or lower mirror. The index guide and outer current blocking region each include a lower and upper epitaxial material layer thereon with an epitaxial interface region in between. At least a top surface of the lower material layer includes aluminum in the interface region throughout a full area of an active part of the vertical light source.

21 Claims, 10 Drawing Sheets

(56) References Cited

U.S. PATENT DOCUMENTS

| | | | |
|---|---|---|---|
| 2003/0053503 A1* | 3/2003 | Yang | H01S 5/18327 372/50.11 |
| 2003/0160254 A1* | 8/2003 | Henrichs | H01S 5/18341 257/88 |
| 2010/0220763 A1* | 9/2010 | Ikuta | B82Y 20/00 372/50.124 |
| 2011/0280269 A1* | 11/2011 | Chang-Hasnain | H01S 5/105 372/50.1 |
| 2012/0018755 A1* | 1/2012 | Speck | B82Y 20/00 257/98 |
| 2018/0019572 A1* | 1/2018 | Deppe | H01S 5/2054 |

* cited by examiner

VERTICAL-CAVITY SURFACE-EMITTING DEVICE WITH EPITAXIAL INDEX GUIDE

CROSS REFERENCE TO RELATED APPLICATIONS

This application claims the benefit of PCT/US2018/018350 Application entitled "VERTICAL-CAVITY SURFACE-EMITTING DEVICE WITH EPITAXIAL INDEX GUIDE", filed Feb. 15, 2018, which claims the benefit of Provisional Application Ser. No. 62/459,078 entitled "VERTICAL-CAVITY SURFACE-EMITTING DEVICE WITH EPITAXIAL INDEX GUIDE AND METHOD OF MANUFACTURE", filed Feb. 15, 2017, which are herein incorporated by reference in their entirety.

STATEMENT REGARDING FEDERALLY SPONSORED RESEARCH

This invention was made with Government support under Phase II SBIR Contract No. W911NF-14-C-0088 awarded by the Department of Defense (DOD) funding agency, the Army Research Laboratory. The U.S. Government has certain rights in this invention.

FIELD

Disclosed embodiments relate to semiconductor vertical cavity diode light sources that include conducting-channel structures for optical and electrical confinement, and their method of manufacturing.

BACKGROUND

Vertical-cavity surface-emitting devices generally use an index guide to provide mode confinement, and this index guide can also provide electrical confinement. The oxide-aperture vertical-cavity surface-emitting laser (VCSEL) is one such device for which the oxide acts as an electrical insulator to provide electrical confinement, while the oxide aperture also produces a mode-confining region that provides transverse mode confinement. This improves the efficiency and modulation speed of the VCSEL.

While the oxide aperture has been successfully used in many VCSEL devices, it has drawbacks for device operation as well as manufacturing and reliability. The material differences between the oxide aperture and remaining semiconductor can cause high internal mechanical strain. Because of this strain and chemical reactivity in the atmosphere, the exposed sidewalls for the semiconductor post etched to create the aperture can cause slow delamination of semiconductor mirror layers and early device failure. In addition the oxide material formed in the semiconductor mirror creates an effective heat block, and increases thermal resistance. The oxide generally has a different thermal expansion coefficient than the oxide, and proceeds through a timed diffusion process that results in aperture size variation across a processed VCSEL wafer.

Other techniques such as buried tunnel junctions covered with conducting epitaxy in a subsequent epitaxial regrowth have also been used to provide mode confinement and electrical confinement in VCSELs. However these approaches can also suffer from poor quality of the epitaxial material due to regrowth if the materials include Al, and can leave a relatively large surface epitaxial step height for which regrowth should be performed over. The problems with epitaxial regrowth are particularly difficult because of the reliance on Al-bearing materials (e.g., AlGaAs or AlGaN) for high quality mirrors. Because of these difficulties however, these types of vertical-cavity surface-emitters have had difficulty in matching the light vs. current and voltage vs. current characteristics that have been possible using oxide apertures. Surface impurities that become interface impurities upon regrowth can be particularly problematic. The surface impurities can also cause poor nucleation during regrowth and surface roughening in the epitaxially regrown layers.

Al-bearing materials generally oxidize according to their Al content. AlAs for example, rapidly oxidizes when exposed to air and can disintegrate and/or fully become detached from the remaining epitaxy and substrate. AlGaAs materials oxidize with a rate that depends on Al-content. The poor regrowth interface due to oxygen and other contaminants such as carbon can then damage or degrade key regions of the VCSEL when regrowth is attempted directly on AlGaAs. Although GaAs has a relatively low oxidation rate in air and has been used as a layer for regrowth of epitaxial mirrors, it is also not an ideal material on which to perform regrowth for many vertical cavity light emitters. The GaAs material itself will also oxidize when exposed to air, and furthermore can cause absorption problems in the mirror of the device for wavelengths shorter than ~880 nm at room temperature.

Therefore improvement in the performance of the vertical cavity light source can be obtained by eliminating the need for a material for GaAs on which to perform regrowth in active area of the light source. The same is true for vertical cavity light sources made in other material systems such as based on nitrides. As a result, despite efforts in developing high quality and fully epitaxial structures for Al-bearing vertical-cavity surface-emitters that can match or exceed the electro-optic performance of the oxide VCSEL while solving problems due to the oxide aperture, these VCSELs have so far in general remained inferior in their device operation and other features to oxide-apertured VCSELs due to either poor interface and/or material quality, or undesirable materials that cause absorption in the vertical cavity light source. Because of oxide aperture technology has thus remained dominant, and the Al-bearing vertical-cavity devices have not yet reached their full potential in electro-optic performance. The technology of VCSELs therefore has a remaining need for vertical-cavity device that can provide epitaxial mode confinement using high quality epitaxial regrowth, while being able to engineer the epitaxial mode confinement for high electro-optic performance.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include semiconductor light sources comprising at least one vertical resonant cavity light source, such as a VCSEL, RCLED, or a surface-emitting LED that comprises Al-bearing materials. The disclosed embodiments also include structures with one or more impurity regions formed selectively in the transverse cavity direction that are used to laterally control the electrical injection to the light emission region of the vertical-cavity device. These impurities can be diffused or implanted. Using the techniques disclosed herein, special masking can be provided for these impurity processes that provide greater manufacturability and repeatability in producing the vertical-cavity light sources that use the disclosed epitaxial apertures.

The disclosed epitaxial confinement structures are fabricated in at least two separate growth steps. An initial epitaxial growth includes a partial structure for a vertical-cavity light source. This partial structure includes an Al-bearing layer that ultimately becomes exposed prior to a subsequent epitaxial growth that covers it. Studies by the Inventor have found that the coverage of this Al-bearing layer by the subsequent growth involves process steps along with the disclosed sacrificial layers to produce high quality epitaxial apertures that have smooth interfaces and low electrical resistance for electrical injection into the mode confining region.

Improved epitaxial index guides and the method of manufacture are disclosed for vertical cavity light sources that use aluminum (Al)-bearing materials at their regrown interfaces to produce high optical quality and low optical scattering due to mode confinement. The high optical quality is due to the combined choice of Al-composition and its grading at an interface layer, and the use of one or more sacrificial layers are used to protect and process this Al-bearing interface layer during fabrication. The epitaxial index guide is optimized in its material properties through choice of specific Al-compositions that comprise it. The regrown interface can generally be identified in the completed vertical cavity light source through lateral compositional changes in the semiconductor material or lateral impurity changes between the effective index guide and the current blocking region. As used herein, using the semiconductor vertical cavity diode light source (vertical light source) 100 shown in FIG. 1 described below for reference, the epitaxial step height ($\Delta H$) refers to the height differential between (i) the height of the epitaxial interface 135 in the inner mode confinement region 133 having the index guide 131 minus (ii) the height of the epitaxial interface 135 in the outer current blocking region 132. $\Delta H$ can thus be zero (no height step), or be a positive (+) value. Zero is thus an allowed value for $\Delta H$ using disclosed index guides. As used herein, a zero $\Delta H$ value refers a step height $\leq |0.5$ Å|. A positive $\Delta H$ value may be desirable for high efficiency in small sized vertical cavity light sources.

A conducting channel can be fabricated into the epitaxial materials around the index guide by modifying the impurity profiles around the guide. For example a conducting channel can be made by impurity diffusion that may be performed inside or outside the index guide. Implantation may also be used, and implantation of impurities, diffusion of impurities, and incorporation by epitaxial growth can each be used. Certain impurities are better in carrying out some steps, depending on whether they easily diffuse or stay relatively fixed in the lattice during heat treatments. This heat treatment can take place in a growth chamber prior to the subsequent epitaxial growth step used to create the regrown interface of the index guide.

The electrical confinement to the index guide is due to an epitaxial current blocking structure formed outside the index guide. This current blocking may be due to a depleted heterojunction, a reverse biased p-n junction, or some other mechanism that maintains high crystal quality.

An advantage of the epitaxial index guide is that can be formed with such high epitaxial material quality that the guide can be formed close to or in the cavity spacer of the vertical-cavity light source. As used herein a "cavity spacer" is defined to be a cavity region that includes the active region where the field undergoes phase change to create the resonance condition of the vertical cavity. Typically the cavity spacer thickness will be approximately an integer number of half-wavelengths thickness. The cavity spacer generally may have an upper cavity spacer region or lower cavity spacer region. For example, in a full wave cavity spacer the first mirror layer may be an AlGaAs layer that has an Al composition that is increased over the material of the cavity spacer. If the active region is placed near the center of the full-wave cavity spacer it will have an upper cavity spacer region and a lower cavity spacer region. In a half-wave cavity, in contrast, the first mirror layer may be an AlGaAs composition that is lower Al content than the cavity spacer. It is also possible that an active region is placed at the upper or lower edge of a cavity spacer, if properly designed to be close to a field intensity peak formed by the cavity spacer.

Upper and lower and above and below and bottom are defined herein to account for which layer or interface is formed in regions relative to the substrate on which the vertical cavity light emitter is formed and on which epitaxial growth is performed. Layers or interfaces referred to upper and above relative to another layer or interface are further from the substrate on which the light source is produced, than layers are interfaces that are referred to as lower or below or bottom relative to a layer or interface. The substrate in any case may ultimately be removed after completion of the epitaxial growth upon further processing of the epitaxial material used to form the vertical cavity light source.

DETAILED DESCRIPTION

Figure 1:
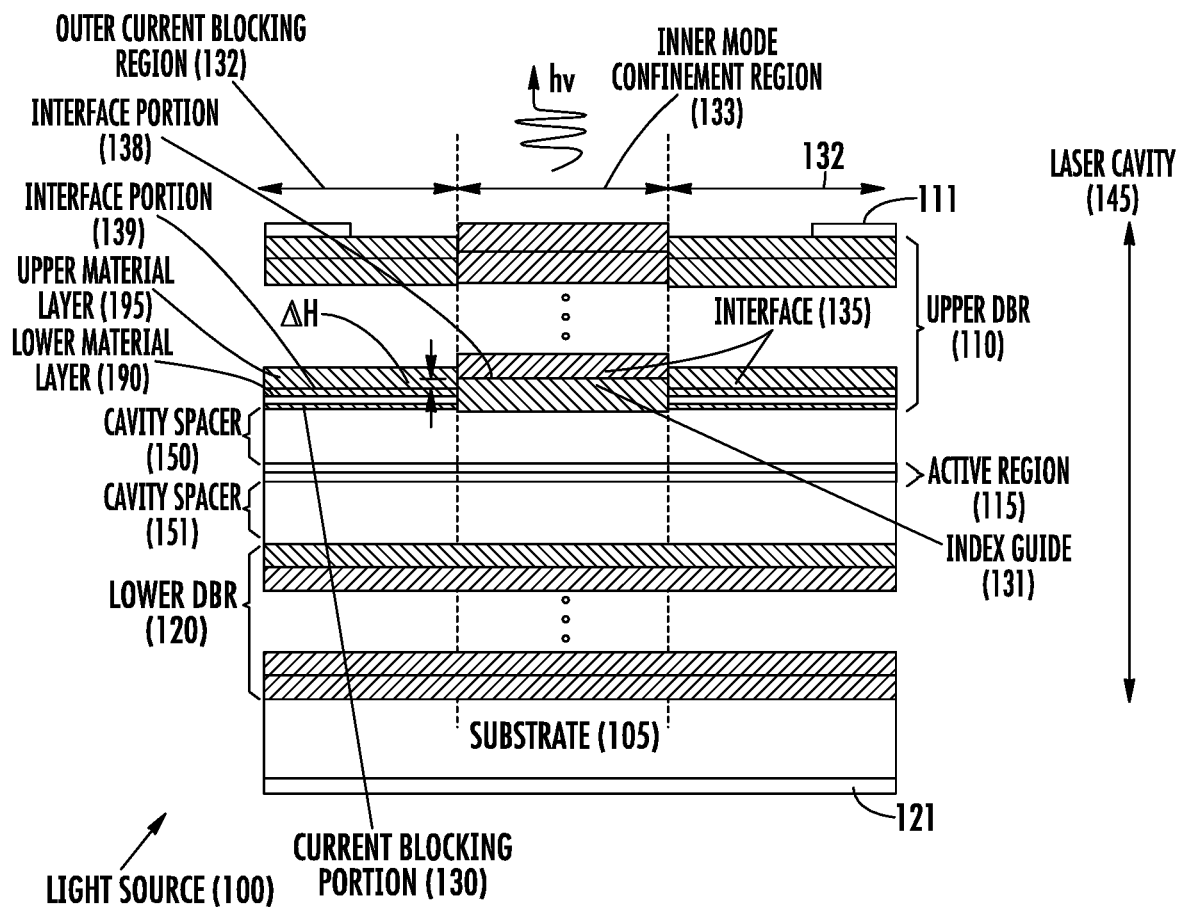
FIG. 1 is a schematic cross sectional diagram of a semiconductor vertical cavity diode light source that includes a disclosed index guide.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 3A:
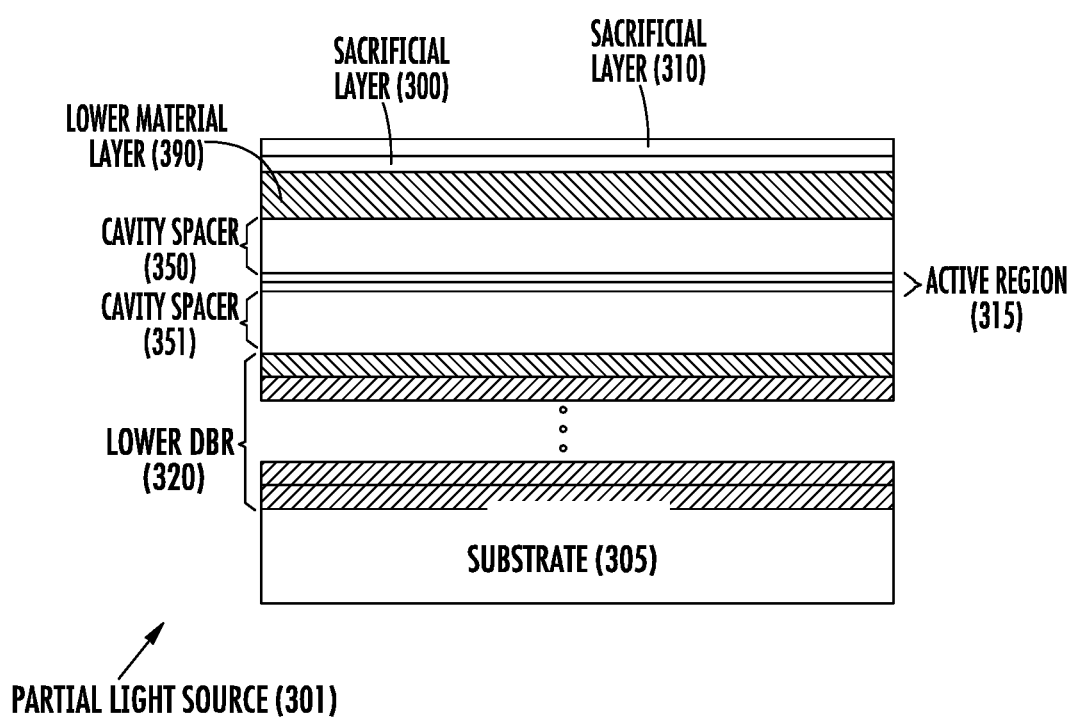
FIG. 3A shows a schematic cross sectional diagram of a partial epitaxial structure for a regrowth that uses two sacrificial layers.
Figure 3B:
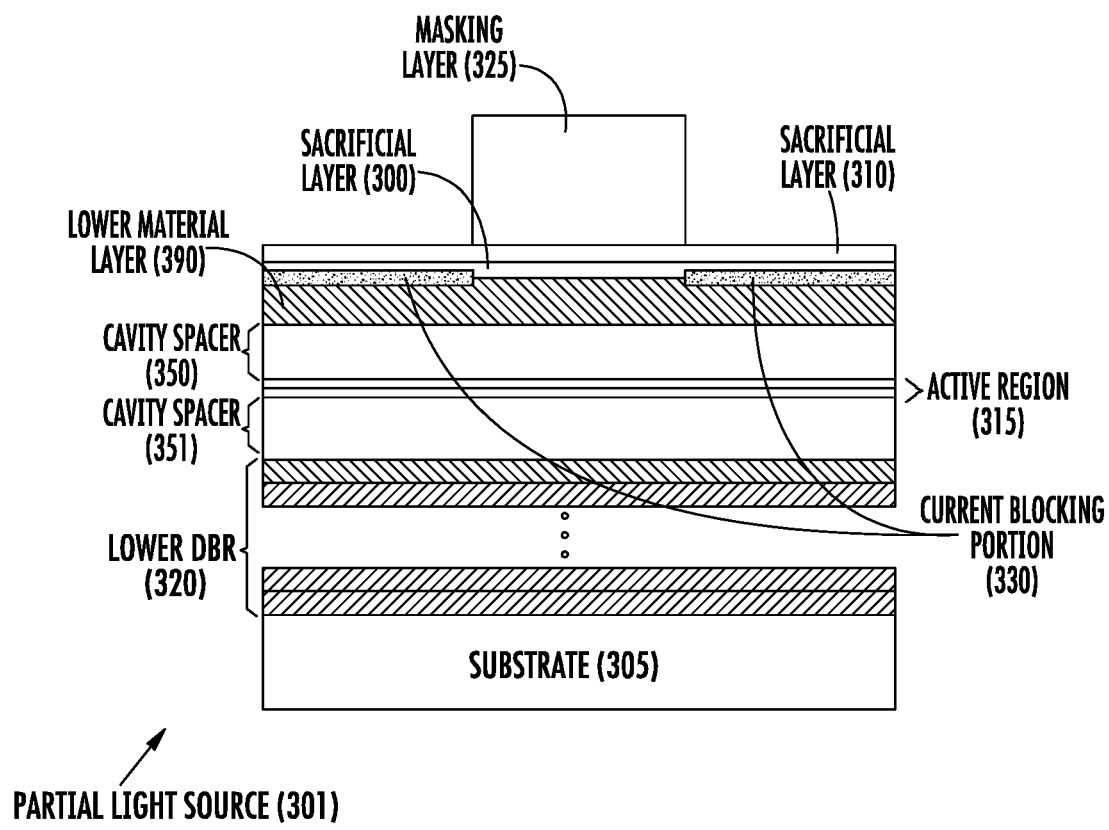
FIG. 3B shows a schematic cross sectional diagram of the partial epitaxial structure of FIG. 3A following masking and ion implantation.
Figure 3C:
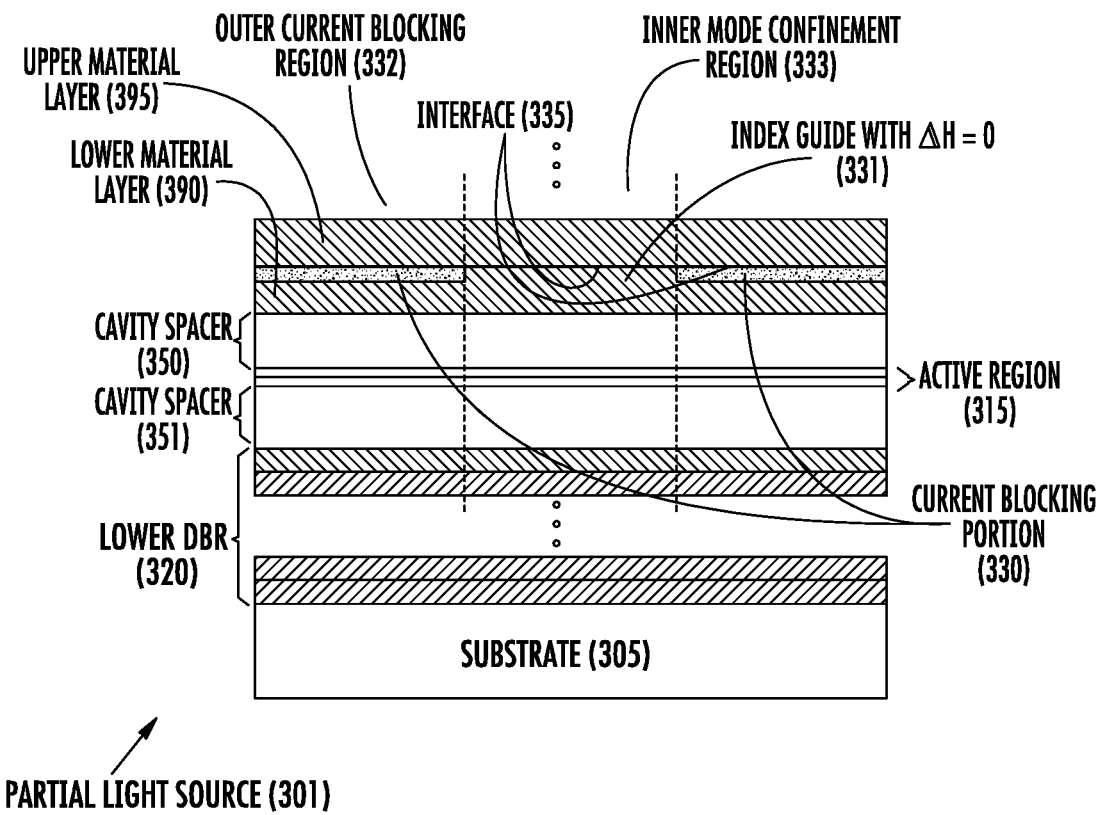
FIG. 3C shows a schematic cross sectional diagram of an epitaxial structure with a $\Delta H = 0$, including the partial epitaxial structure of FIG. 3B following removal of the masking layer, reloading into the epitaxial growth chamber, removal of the two sacrificial layers, and epitaxial regrowth.

Disclosed vertical light sources feature index guide structures that can be made with high crystal quality and incorporate index guides due to their fabrication using disclosed sacrificial layers. These sacrificial layers can be selectively etched both outside and inside an epitaxial growth apparatus when forming the index guide. As described above and used herein, $\Delta H$ is controlled through epitaxial layer thickness used to form the mesa, and processing details of these epitaxial layers. Following a convention for index guiding for which the index guide can have relative refractive index values that are positive, negative, or zero relative to the index in a cladding region, and $\Delta H$ can also have a positive, or a zero value. The fabrication for $\Delta H = 0$ is shown in FIGS. 3A-3C described below, then in FIG. 3C the final structure is shown.

The patterned sacrificial layers allow formation of high quality buried mesas of designed $\Delta H$ through transfer of lateral patterns of impurities and/or crystal steps into buried high quality epitaxial structures suitable for vertical cavity light sources. It can be an advantage that the sacrificial layers that remain on first grown bottom layer that remain on the surface be free of Al. However, in the structures disclosed herein the first grown lower material of both the index guide and the region outside the index guide should be Al-bearing III-V semiconductor when exposed to the subsequent regrowth. Therefore the lower material layer grown in the first growth that exists at the interface following the subsequent growth is fully Al-bearing in the index guide and current blocking regions adjacent the index guide. The choice of Al composition of the first grown lower material and its sacrificial layer materials can be significant to forming a high quality mode confinement that can deliver low optical loss, high electrical conductivity, and high thermal conductivity.

Fabricating the index guide involves one or more sacrificial layers to remain on the region of the index guide when the wafer is loaded into an epitaxial growth system for an eventual subsequent epitaxial regrowth. In this case the sacrificial layers can be removed selectively through thermal etching in the growth system, using the Al-bearing material as an etch stop to form the index guide. Processing of the sacrificial layers outside the region of the index guide need not offer the same protection for the regrown interface nor achieve the equivalent crystal quality, since this region will serve to block electrical current.

Impurities can be introduced into the sacrificial layers during epitaxial growth or after growth using patterned implanted ions. Standard photoresist can be used for the patterning and removed from the sacrificial layers after patterning using standard semiconductor processing. The patterned sacrificial layers can therefore be used as diffusion sources, or as protective layers through which implanted impurities may be introduced.

Zero and near-zero index confinement can be achieved using a plurality of sacrificial layers while maintaining a high quality epitaxially regrown interface. The sacrificial layers can then include a range of compositions that can be thermally etched at different rates. In-bearing sacrificial layers are particularly useful when grown on underlying sacrificial layers. Indium-grading can also be used to form shaped apertures. If the In-bearing sacrificial layer is metamorphic with high strain and high dislocation density, it can be grown on an underlying lattice matched sacrificial layer. The underlying lattice matched sacrificial layer can then minimize the defects due to strain that otherwise may be incorporated in the non-sacrificial layers that make up the epitaxial index guide. This is possible for example if an InAs sacrificial layer has an underlying sacrificial layer of GaAs, with an epitaxial layer of AlGaAs used to form the epitaxial index guide. For this case the GaAs sacrificial layer will protect the underlying AlGaAs epitaxial from undue strain and defects caused by the metamorphic InAs sacrificial layer. At the same time the InAs sacrificial layer can offer high protection from surface contaminants because its oxides are readily desorbed thermally. This is also the case for example, for a metamorphic InN sacrificial layer that is grown on a GaN sacrificial layer that is approximately lattice matched to an AlGaN common epitaxial layer.

FIG. 1 is a schematic cross sectional diagram of an example vertical light source 100 that includes an epitaxial index guide 131, and an outer current blocking region 132 that includes a current blocking portion 130 which frames the index guide 131. A positive epitaxial step height is shown, with a $\Delta H > 0$. The index guide 131 and outer current blocking region 132 include an epitaxial interface 135 comprising a lower material layer 190 and upper material layer 195. This epitaxial interface 135 can be evidenced by high resolution microscopy or other high resolution imaging techniques. Regrown interfaces tend to have a different material make-up compared to other epitaxial material interfaces due to contaminants introduced by epitaxial processing. This formation includes processing and exposing the epitaxial surfaces to be subsequently grown upon to air and process materials. Even following a subsequent epitaxial regrowth, these contaminants will generally be detectable at the epitaxially regrown interface by techniques such as secondary ion mass spectroscopy (SIMS) or transmission electron microscopy (TEM). Obtaining high material quality despite these surface contaminants and their accumulation is a key step in realizing the high crystal quality that leads to superior performance and reliability provided by vertical light source 100. Otherwise surface scattering and extensive defects will exist in the light source, degrading its performance and shortening its useful operating life.

The epitaxial interface 135 in FIG. 1 comprises two different portions, interface portion 138 having interface impurities that is within the index guide 131, and interface portion 139 having interface impurities which is outside the index guide 131. The epitaxial interface 135 may be absent away from the active part of the vertical light source 100 (i.e., the active part is the region that overlaps the optical mode), such as to form alignment marks for fabrication. Despite the epitaxial interface 135 including Al that may be identical in Al content relative to the lower material layer 190, the impurities at the epitaxial interface 135 in interface portions 138 and 139 can be quite different. Interface impurities in interface portion 138 of the epitaxial interface 135 can be made to have much lower interface impurities compared to interface portion 139. The reduced concentration of unwanted impurities such as oxygen can result in much lower electrical resistance through the index guide 131, and much smoother epitaxy. The fabrication and process details for reduction in interface impurities in interface portion 139 and the formation of the index guide 131 are described below.

The outer current blocking region 132 can be formed from an implanted impurity in the III-V lattice such as Si or other donors or oxygen, or other impurities or lack of impurities that create a resistive region outside the index guide and are stable upon a subsequent regrowth. Impurities or defect mechanisms such as caused by proton (H+) implantation that easily anneal out of the crystal and lose their ability to provide blocking are not as effective. This is because the desired growth temperature to produce high quality material for upper material layer 195 and the epitaxial layers that follow to complete upper DBR 110.

Oxygen is a periodic table column VI impurity that should otherwise be a donor in a III-V crystal. Its bonding therefore increases its stability in the crystal. However, oxygen also forms deep levels, especially in AlGaAs, that make the material resistive. The stability of the oxygen in the III-V lattice helps to retain its material resistance even upon high temperature annealing. The outer current blocking region 132 may also be formed from grown in impurities that are countered doped by processing in forming the index guide. It is an advantage that if impurity regions are used to form the upper material layer 190 of the outer current blocking region 132 that they be maintained mainly in a thin region. This way they can be formed close to the active region 115 of the vertical light source 100, if desired, to increase the light source efficiency. The current blocking shown in FIG. 1 and FIGS. 2B-E assumes that the ion implantation forms a depleted heterojunction outer current blocking layer 132. However, other types of current blocking such as pnpn blocking can also be used.

In FIG. 1 the current blocking portion 130 and index guide 131 are formed from a lower material layer 190 that is Al-bearing which can comprise $Al_xGa_{1-x}As$, with a generally desirable composition range of $x \geq 0.05$ at the epitaxial interface 135. In some cases it may also be desirable that lower material layer 190 has a graded composition so that x varies from a low concentration less than x~0.05. The graded regions may be used for example to form index guides with varying interface shapes. The shapes may be selected for optical confinement to deliver improved beam and cavity properties. Using the techniques disclosed herein, this Al content can play a significant role in producing the high quality mode confinement region. Lower material layer 190 shown in FIG. 1 may comprise the first distributed Bragg reflector (DBR) layer of the upper mirror, although this is not a requirement. However it is generally important that the index guide 131 and outer current blocking region 132 are compatible with resonance conditions needed by the vertical cavity of the vertical light source 100 in forming mode confinement for the laser cavity 145. The final layer thicknesses following the completion of the vertical-cavity epitaxy should generally be designed to reach the resonance condition between the laser cavity 145 and the gain spectrum from the active region 115.

Lower material layer 190 may include graded or varied Al compositions as long as its Al content remains sufficiently high at interface 135. $Al_xGa_{1-x}As$ with $x \geq 0.05$ in the lower material layer 190 at the epitaxial interface 135 can provide high quality for the index guide 131. In some arrangements the Al-content at the top of lower material layer 190 at the epitaxial interface 135 will include 15% or more Al-content on the available Column III sites of the lattice. This will increase the thermal stability of the epitaxial interface 135 during epitaxial regrowth and provide greater thermal etch selectivity between the sacrificial layers to be removed from above lower material layer 190. Depending on the desired $\Delta H$, the Al-content on the Column III lattice sites in the lower material layer 190 may range from 15% to 35% Al-bearing for $\Delta H>0$. The index guide 131 forms an inner mode confinement region 133, while the outer current blocking region 132 includes the current blocking portion 130.

The vertical light source 100 is shown further including a substrate 105 upon which epitaxial growth takes place to form the laser cavity 145. A lower mirror shown as lower DBR 120 and upper mirror shown as an upper DBR 110 also make up the vertical cavity light source. Upper electrode 111 and lower electrode 121 are also shown for electrical contacting. The p and n doping of the lower DBR 120, the lower material layer 190, the upper material layer 195 and the upper DBR 110 are designed for high injection efficiency into the active region 115 of the laser cavity 145. The laser cavity 145 as shown in FIG. 1 includes a lower cavity spacer 151 below the active region 115, and an upper cavity spacer 150 above the active region 115. The substrate 105 may be removed from the vertical light source 100 for some applications. This can make the vertical light source 100 into a freestanding film. Or a freestanding film can be fabricated that contains multiple light sources and arrays of light sources. These freestanding film-based light sources can be useful in transfer to other substrates or platforms.

The index guide 131 forms an epitaxial step of height ($\Delta H$) shown in FIG. 1, and this step height may take a range of positive values as shown in FIG. 1. Positive $\Delta H$ values produce optical mode confinement, confining the laser light to the index guide 131, through a vertical cavity resonance shift due to the longer cavity in the inner mode confinement region 133 relative to the outer current blocking region 132 that makes $\Delta H>0$. This mode confinement is highly desirable for high speed modulation and reducing the lateral cavity size. A zero value for $\Delta H$ leaves mode confinement only due the electrical injection and resulting optical gain distribution and additional mechanisms that may cause weak resonance shifts between outer current blocking region 132 and inner mode confinement region 133. Values of $\Delta H$ around zero can also have a desirable feature of producing improved single mode power and performance with greater power through increasing the side-mode-suppression-ratio (SMSR) for a larger mode size. Also disclosed herein are structures for which ΔH=0. (see FIG. 3C described below).

It is an advantage that ΔH can remain relatively small and yet provide strong optical confinement of the lasing mode to the index guide 131. ΔH can be ≤500 Å, such as ≤200 Å. A problem with the mesa confinement when the mesa is too tall is optical scattering. The amount of scattering even in an ideal mesa and overgrowth depends on the size of ΔH. However if ΔH is too large the epitaxial overgrowth of the subsequent growth step can also suffer. This is because the mesa can reveal different crystal surfaces at the edge of the mesa than on the top. These different crystal surfaces can have different growth rates than on top of the mesa. Keeping ΔH only sufficiently large to optimize the performance of the vertical-cavity light source can therefore reduce the scattering effects and improve the light source performance. By keeping ΔH≤500 Å this loss due to non-uniform epitaxial overgrowth and the optical scattering caused by even an ideal taller mesa can be reduced. Herein methods are disclosed to form mesa heights (ΔH)≤20, i.e., 0 Å to 20 Å.

Figure 2A:
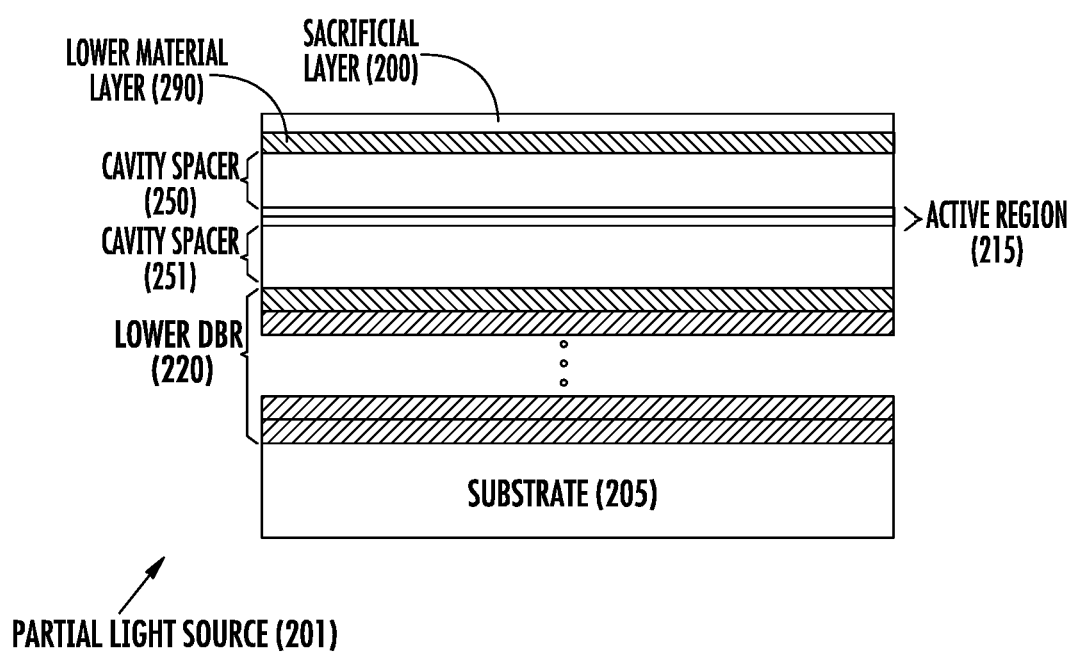
FIG. 2A is a schematic cross sectional diagram of a partial epitaxial structure for a vertical cavity surface emitter to be processed for epitaxial regrowth.

FIGS. 2A-D show a partial light source 201 to show growth of a vertical cavity light source and fabrication steps that can be used to form the index guide 131. FIG. 2A shows a substrate 205, a lower DBR 220, a lower cavity spacer 251, active region 215, upper cavity spacer 250, lower material layer 290 that is Al-bearing, and a sacrificial layer 200. The lower material layer 290 comprising Al is assumed for FIG. 2A to be doped with grown-in acceptor impurities such as carbon to make this layer of p-type conductivity, but other schemes to form a conducting channel under the index guide to be formed can also be used. For example, lower material layer 290 can be grown undoped and then selectively doped with implant or diffusion of impurities following the growth of the bottom structure, to form a conducting channel under the index guide 131 that is also to be fabricated. The lower material layer 290 may comprise $Al_xGa_{1-x}As$ with 0.05≤x≤0.5, for example.

Sacrificial layer 200 may be GaAs or InGaAs. InAs may also be used for the sacrificial layer 200 but is less attractive for direct growth on the lower material layer 290 because of lattice-mismatch. If extensive defects result at the interface between the lower material layer 290 and sacrificial layer 200, these defects will in general be retained in the light source. Therefore if the sacrificial layer 200 comprises InGaAs, the combined In content and layer thickness should be chosen such that the sacrificial layer remains low in defects, or close to or less than its thickness for which extended dislocations are formed. The result is that although InAs can be an attractive sacrificial layer for its ability to remove much of the surface contaminants from processing, it is less attractive as a sacrificial layer unless a plurality of sacrificial layers are used with different compositions. This aspect is described further below. The important point is that the sacrificial layer 200 and lower material layer 290 are suitable for forming the index guide and form a relatively defect free interface in the as grown first growth, using the process methods disclosed herein.

As noted above, the lower material layer 290 may be $Al_xGa_{1-x}N$ with graded x or x≥0.05 at its interface with sacrificial layer 200, while sacrificial layer 200 can be GaN or InGaN. Furthermore, the sacrificial layer 200 may include an impurity dopant suitable for diffusion, such as Zn, Be, Mg, or other acceptor from a column II of the periodic table of elements. These acceptor impurities generally tend to be fast diffusers that produce minimal damage in the crystal when diffused at relatively low atomic concentration. Doping the lower material layer 290 with carbon gives it a stable acceptor impurity that maintains the conductivity in a high temperature anneal or growth step.

Figure 2B:
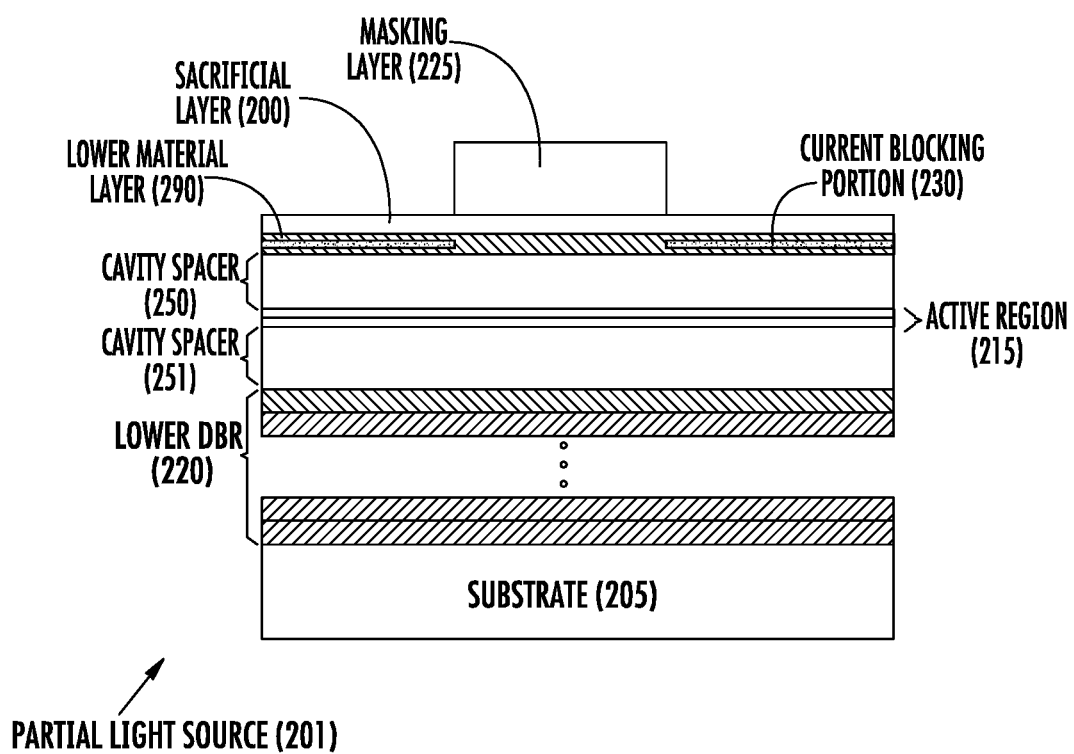
FIG. 2B shows a schematic cross sectional diagram of the partial epitaxial structure of FIG. 2A following dielectric masking and ion implantation.

FIG. 2B shows the in process device structure following processing external to the epitaxial growth system. In FIG. 2B a thick patterned masking layer 225 that has been deposited onto sacrificial layer 200 and patterned. This masking layer can be used to block an ion implant. In addition, the masking layer can also be used to perform a controlled etch into the lower material layer 290 to define the index guide. For example, a very shallow implant of a stable impurity, such as Si or O, is implanted into lower material layer 290 to form or partially form the current blocking portion 230 using masking layer 225 can block the implant in the region to become the index guide. To maintain the implant as shallow a low energy and as low of dose as possible is used, and the implanted region can be combined with a depleted heterojunction current blocking region. It can be desirable for the sacrificial layer 200 to remain on the epitaxial surface outside the patterned masking layer 225 during some of the processing, especially if shipping of a partial structure of a vertical cavity light source is needed in manufacturing.

Figure 2C:
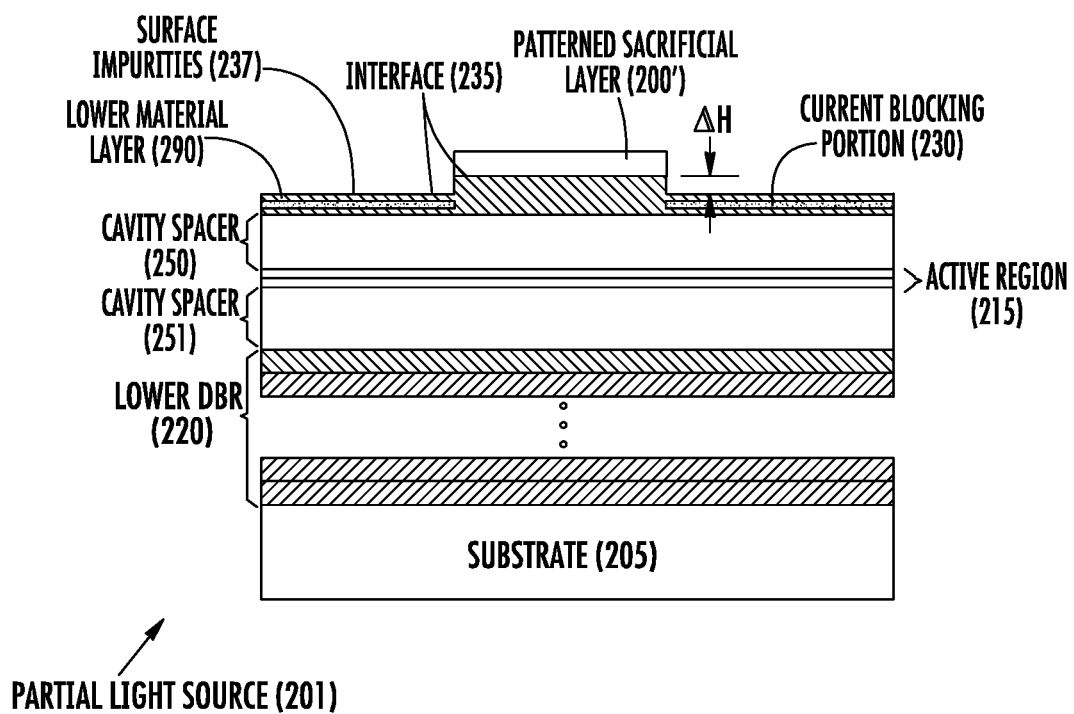
FIG. 2C shows a schematic cross sectional diagram of the partial epitaxial structure of FIG. 2B following selective etching of the sacrificial layer and removal of the dielectric masking.
Figure 2D:
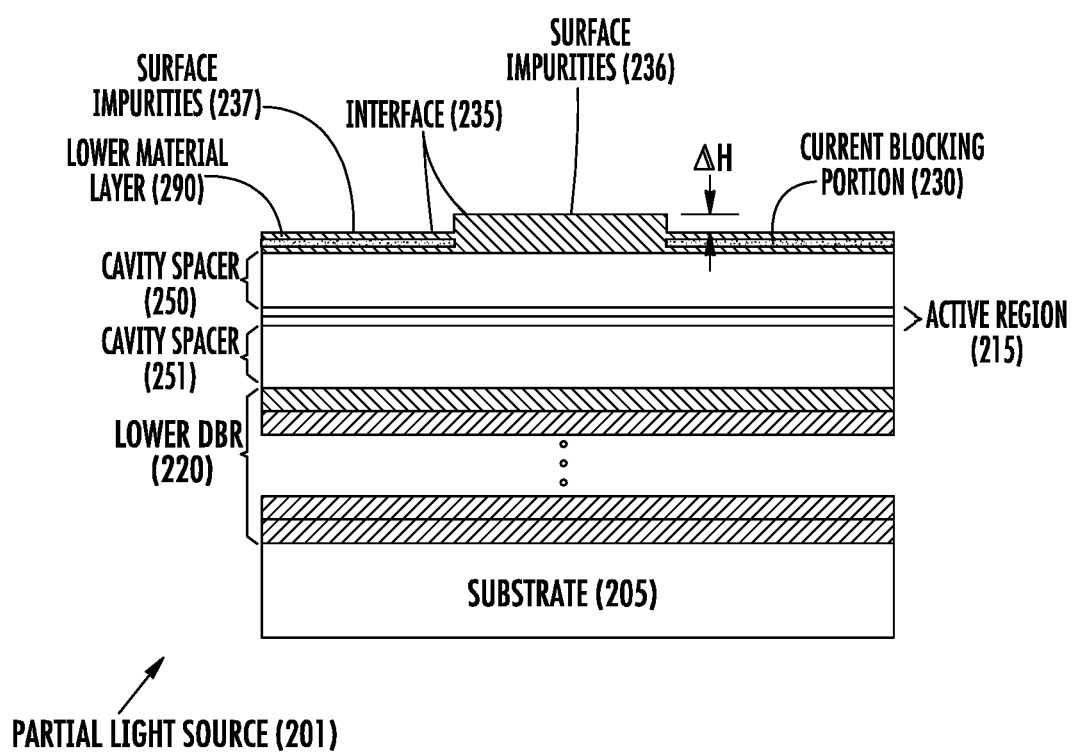
FIG. 2D shows a schematic cross sectional diagram of the partial epitaxial structure of FIG. 2C after loading in a growth chamber and thermal etching within the growth chamber to remove the final portions of the sacrificial layer.

FIG. 2C shows the partial structure of the first growth after selective etching of the sacrificial layer to form a patterned sacrificial layer 200 and part of the lower material layer 290, followed by removal of masking layer 225. This can be performed after processing such as ion implantation. The selective etching of the sacrificial layer 200 is a significant step, and should include a precise etch and Al composition in lower material layer 290. The result of the selective etching is the formation of two interfaces of the lower material layer 290 comprised of Al-bearing material. Assuming the sacrificial layer 200 is an arsenide comprising material such as GaAs or pseudomorphic or low defect InGaAs, citric acid/hydrogen peroxide etches can produce excellent selectivity. For example citric acid/$H_2O_2$ ratios by volume of 2:1 to 4:1 form high selectively etches for etching GaAs or InGaAs versus $Al_xGa_{1-x}As$ of x~0.2 to x~0.95. Citric acid can also be used to stop on an AlAs lower layer, but the AlAs layer can be degraded by citric acid. The lower material layer can comprise an Al-bearing material at its top surface that will become the epitaxial interface 235 that has 0.15≤x≤0.50 so that relatively high quality epitaxy can be achieved directly on the Al-bearing lower material, despite that the region outside the index guide is exposed outside the growth system. This enables ΔH>0 to be formed for index guiding with high quality growth at the epitaxial interface 235.

The Al content for the surface of lower material layer 290 that is exposed outside the epitaxial growth system can be important. The epitaxial interface 235 of the lower material layer 290 outside the sacrificial layer 200 will oxidize and collect other contaminants that become surface impurities 237 (are on an atomic scale) in exposed regions of the lower material layer 290 that has AlGaAs at its surface. Furthermore the choice of Al composition combined with selective etching or reactive ion etching is important.

The material compositions containing x≥0.05 and x≤0.5 are desirable because they can selectively stop or slow down the citric acid etch after removal of a thin surface region of the Al-bearing material of lower material layer 290. This removal and the remaining patterned sacrificial layer 200 of FIG. 2C exposes the portion of lower material layer outside the patterned sacrificial layer to air. The region of the lower material layer that is under the remaining patterned sacrificial layer 200 remains protected. Therefore along with forming the step height (ΔH), the processing retains protection of the critical interface region that will become the epitaxial interface 235 within the index guide 231. This protection of the interface can then produce low electrical resistance through the index guide 231 that will also be formed.

The Al-bearing material compositions near the interface of the lower material layer 290 and sacrificial layer 200 can be graded or uniform. If graded, the citric acid-hydrogen peroxide solution can be adjusted to stop preferentially on an Al content that is part of a graded layer, and establishes the value of ΔH. The key is to perform a controllable etch into the lower material layer 290 that stops, exposing the surface of the Al-bearing material, but with Al content at the surface that can still receive a high quality epitaxial regrowth. The Al content should therefore be sufficiently high to accurately stop the citric acid etch, while sufficiently low to enable high quality epitaxial regrowth in this region. Work by the Inventor has found that Al contents of $Al_xGa_{1-x}As$ that can be used to produce high quality epitaxy and index guiding has a composition generally of $0.15 \leq x \leq 0.35$, unless a ΔH=0 is desired. The case of ΔH=0 is described below, and in this case a greater range of Al-content can be used, including AlAs with x=1.

After cleaning, the sample can be returned to an epitaxial growth system for a subsequent regrowth. Prior to this regrowth the sacrificial layer 200 is fully removed in-situ in the growth chamber. This removal may be under arsine or arsenic flux, depending on the growth technique, or some other stabilizing flux depending on the specific materials. The sacrificial layer 200 can be removed using substrate temperatures between 550° C. and ~750° C., depending on its indium content. Ideally though the removal is performed between 650° C. and 700° C. These temperatures then can provide an effective stop for the removal of sacrificial layer 200 shown in FIG. 2D, while producing minimal removal of material of the lower material layer 290 that will form epitaxial interface 235 between lower material layer 290 and sacrificial layer 200 prior to removal of the sacrificial layer 200.

The use of Al-bearing material at the epitaxial interface 235 then allows two different selective etches of the sacrificial layer 200 to form the index guide 231. The first etch of sacrificial layer 200 is performed outside the growth system and chosen to leave a step height relative to the interface between the lower material layer 290 and sacrificial layer 200. This is performed through choice of material content of layer 200, such as pseudomorphic InGaAs or GaAs, the choice of Al content profile at the interface between the lower material layer 290 and sacrificial layer 200, and the method of etching. Wet etching can be made to selectively stop and leave a high quality AlGaAs surface on which to perform regrowth. Reactive ion etching can also be used for example, to obtain a precise etch depth into the lower material layer 290.

The selective etch outside the growth chamber and the selective etch inside the growth chamber therefore leave two different types of surface impurities at the interface 235. Surface impurities 237 at the surface of the lower material layer 290 outside the mesa step are due to wet etching and exposure to atmosphere, while surface impurities 236 are due to thermal etching in the epitaxial growth chamber. Therefore surface impurities 236 can be in much lower concentration than surface impurities 237 because this surface has not been directly exposed to the atmosphere or other contaminating ambient outside the growth chamber.

The selective removal by thermal etching in the growth chamber can be performed under a stabilizing Column V flux that can be arsine, arsenic molecular flux, or nitrogen bearing Column V species for nitride bearing materials. The Column V overpressure limits degradation of the surface during the thermal etch. The selective removal in the growth chamber enable removal of much of the contamination that may have accumulated on sacrificial layer 200 during processing outside the growth chamber.

Figure 2E:
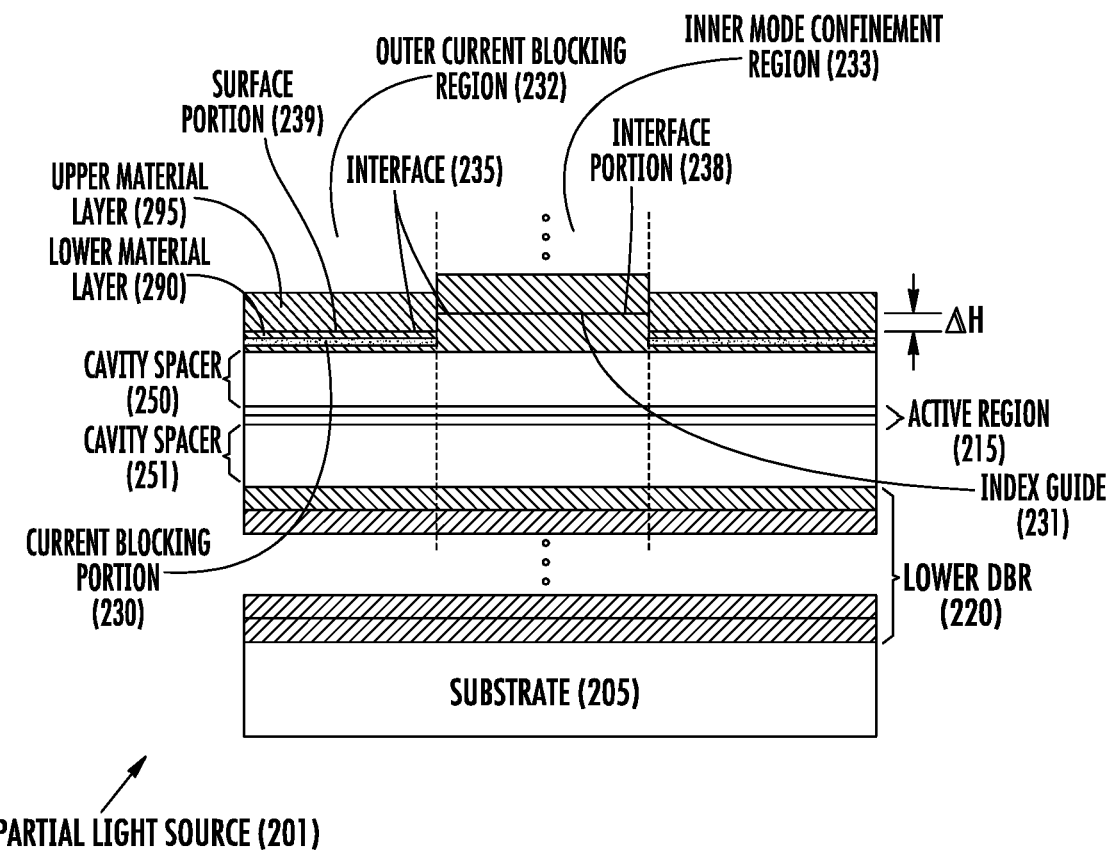
FIG. 2E shows a schematic cross sectional diagram of the epitaxial structure following epitaxial regrowth on the structure shown in FIG. 2D.

FIG. 2E shows the resulting structure following the epitaxial regrowth starting with the upper material layer 295. The epitaxial interface 235 upon which the regrowth is performed is a fully exposed Al-bearing material from a pre-existing lower material layer 290. As shown a portion of the lower material layer 290 has been exposed outside the epitaxial growth chamber, while the portion of the lower material layer 290 that comprises the index guide is exposed in the growth chamber. The current blocking portion 230 is shown outside the inner mode confinement region 233. The index guide 231 has an optical confinement strength to the inner mode confinement region 233 set by ΔH.

The strength of this index guide 231 to confine the lasing mode becomes an important parameter in setting the efficiency and speed of small cavity vertical cavity light sources. For larger diameter smaller ΔH can reduce the number of lasing modes through weaker optical confinement. ΔH can range from 1 Å using this technique to 500 Å or more. In general, the step ΔH will designed based on the etch choice and Al composition of the lower material layer 290. The index guide 231 also provides electrical confinement, since its sacrificial layer (sacrificial layer 200 described above) was used to pattern the interface between the lower material layer 290 and the epitaxial regrowth. This mode confinement with a ΔH value in the range of 50 Å to 200 Å is generally needed for high-speed modulation due to the importance of small active volumes. These small active volume vertical-cavity light sources benefit from having high overlap with the gain area. Less mode confinement and even a step with ΔH=0 is generally more favorable to produce single mode operation, especially with high power.

Because the epitaxial regrowth of upper material layer 295 on lower material layer 290 can proceed partly on AlGaAs that has been exposed to the atmosphere during processing, as described above its composition may generally be further improved by choosing the surface $Al_xGa_{1-x}As$ to have composition with $0.2 \leq x \leq 0.35$ if wet etching is used, for example with citric acid/hydrogen peroxide mixture. This content of Al enables selective wet etching while stopping on the desired Al content in lower material layer 290, while still enabling high quality epitaxial regrowth in the region outside the index guide 231. This is because the surface contaminants in the surface portion 239 can be maintained at a sufficiently low concentration for an upper material layer 295 of high quality to be epitaxially grown on the lower material layer 290. Though impurities and possibly some defects may exist in this interface 235, current flow is not desired in this region. At the same time the regrowth of the upper material layer 295 on the region of the lower material layer 290 in the epitaxial index guide 231 can take place for which interface impurities in interface portion 238 remain at a low level due to the in-situ thermal etching.

FIGS. 3A-3C show the fabrication steps and a completed structure to form an index guide with a ΔH=0. FIG. 3A shows a partial lower structure 301 of an in-process vertical cavity light source that includes two (double) sacrificial layers of two different materials. A greater plurality of sacrificial layers (e.g., 3 or more) can also be used to obtain desired shapes and impurity profiles for the index guide and current blocking region. FIG. 3A also includes a substrate 305, a lower DBR 320, a lower cavity spacer layer 351, an active region 315, an upper cavity spacer layer 350, lower material layer 390 (e.g., a DBR layer), sacrificial layer 300, and a second sacrificial layer 310. There is also an index guide 331 with a ΔH=0 that forms an inner mode confinement region 333, while the outer current blocking region 332 includes a current blocking portion 330.

In FIG. 3A sacrificial layer 300 is shown on a lower material layer 390 that has AlGaAs at its upper surface and at its interface between the sacrificial layer 300. Sacrificial layer 310 which is on top of sacrificial layer 300 can be ideally made from an arsenide material with selective etch properties to GaAs, such as InGaAs or InAs, but that can have superior cleaning properties when removed in the growth chamber than GaAs. Making the sacrificial layer 310 of InAs can also improve surface cleaning in the growth chamber since oxides are more easily removed with InAs than with GaAs.

FIG. 3B shows how the double sacrificial layers can provide surface protection to what will become the regrown interface, while enabling the index guide to have a ΔH=0. Masking layer 325 shown in FIG. 3B can be a dielectric layer or a photoresist layer patterned to block an impurity ion implant. Current blocking portion 330, which can comprise a donor dopant such as Si, O, or other impurities, can be selectively implanted using photoresist masking or other masking around the region that will become the index guide (see index guide 331 in FIG. 3C described below). By maintaining sacrificial layer 300 as covering the surface, and by choosing the Al-composition of the lower material layer 390, a zero index confinement can be achieved.

FIG. 3C shows the vertical cavity light source following removal of both the sacrificial layer 310 and the sacrificial layer 300 in the epitaxial growth system. The use of a double including a sacrificial layer 300 being GaAs and a sacrificial layer 310 being InGaAs or InAs can more surface cleaning as compared to a single sacrificial layer of GaAs or InGaAs. This is especially true if InAs is used. Oxides formed on InAs can be much more volatile than on GaAs. For this case the lower material layer 390 has been designed with sufficiently high Al-composition to remain essentially planar upon the removal of sacrificial layer 300. The DBR layer 390 can comprise of $Al_xGa_{1-x}As$ at its surface with $0.05 \le x \le 1$. The ability to use AlAs for a regrowth surface in the lower material layer 390 is enabled by sacrificial layers 300 and 310 remaining on the surface.

Now since the sacrificial layers 300 and 310 remained on the epitaxial surface outside the portion of lower material layer 390 needed to form the index guide, ΔH=0 can be formed. This is useful for large area lasing modes that need narrow beam divergence or high SMSR. It can also lead to improved material quality outside of the index guide 331.

The lower material layer 390 can take on a greater range of Al content at the epitaxial interface 335. Typically high Al content $Al_xGa_{1-x}As$ will rapidly oxidize in air making compositions with $x \ge 0.4$, and this could degrade the lower material layer 390 significantly for the structure of FIGS. 2A-D shown as lower material layer 290. However the fabrication shown for FIGS. 3A-C can use $x \ge 0.4$ and even $x=1$ at the epitaxial interface 335. This is because the sacrificial layers are left intact over the active area of the vertical light source, so that even AlAs can remain protected from significant degradation due to device processing.

The choice of Al-composition at the regrowth interface 335 determines how high in temperature and to some degree the cleanliness that can be achieved. For example, if InAs is used for the sacrificial layer 310, it can generally be removed in the epitaxial growth chamber through thermal etching at ~500° C. and above. Making sacrificial layer 300 out of GaAs, allows it to generally be removed in the epitaxial growth chamber at temperatures above 600° C., such as at temperatures >650° C. In this case a two-step removal process of sacrificial layers 300, 310 can be used, with much of the contaminants from processing removed with the sacrificial layer 300 comprising InAs.

The removal of InAs can be performed at much lower temperatures between 500° C. and 600° C., for which surface impurities that exist on the InAs are removed with the InAs without these impurities penetrating more deeply into the material below the surface. Once impurities such as oxygen or carbon reach the GaAs beneath the InAs, for example by diffusion, the GaAs becomes more difficult to remove while leaving a high quality surface for regrowth. On the other hand if GaAs is not used next to the layer intended for regrowth, the lower material layer 390 such as a DBR layer, the strain defects caused by InAs at the interface with the lower material layer 390 can remain following regrowth. These defects can reduce device reliability. Using multilayer sacrificial layers allows the final layer to be chosen for better surface cleaning even though it may be highly strained and metamorphic with crystal dislocations.

Therefore although for FIG. 3A it is generally an advantage to use a sacrificial layer 300 that is relatively close to being lattice matched to the lower material layer 390 to obtain low defect concentration at the interface, the sacrificial layer 310 need not have the same low defect concentration at its interface with sacrificial layer 300. Sacrificial layer 310 can then be metamorphic, such as for InAs grown on GaAs. For this case InAs is more easily removed along with surface contaminants than GaAs, and damage that otherwise occurred at the interface between sacrificial layer 300 and sacrificial layer 310 is removed and does not influence the regrown interface shown in FIG. 3C.

Therefore using a plurality of sacrificial layers with different material properties can be desirable to remove surface contaminants in multiple process steps in the growth chamber (i.e. by removal of sacrificial layers under different etch temperatures.) High quality epitaxially regrown interface can then be obtained to form a high quality vertical cavity light source. The plurality of sacrificial layers may include GaAs or nondislocated (pseudomorphic) InGaAs grown on the lower material layer 390 comprising an Al-bearing common epitaxial layer, compositionally graded regions to further control etch and sacrificial layer removal in the growth chamber, or alternating materials such as GaAs/InGaAs/GaAs that may further improve surface cleaning. Metamorphic layers such as InAs may also be included, such as for layer 310. Ideally such metamorphic layers are generally not be formed directly on the lower material layer 390. Layer 300 would instead be lattice matched, pseudomorphic, or at least grown to produce low defect concentration at the interface between lower material layer 390 and sacrificial layer 310.

The sacrificial layers 300, 310 in FIGS. 3A-3C, as well as the sacrificial layer 200 in FIGS. 2A and 2B can be maintained as relatively thin and range from thicknesses of a few thousands of angstroms to tens of angstroms. Sacrificial layers ≤500 Å can be desirable because they are generally easier to remove using thermal etching than thicker layers. Because metamorphic layers can be used, a wide range of compositions can be used for the sacrificial layers. As noted above a plurality of sacrificial layers greater than two may be used as long as they can be removed easily before or within the epitaxial growth chamber. However, the sacrificial layers that remain on the surface when returned to the growth chamber can be-Al-free, such as including only Ga and In along with the relevant Column V species, at least in the index guide region and that region that overlaps the active area of the light source.

Figure 4:
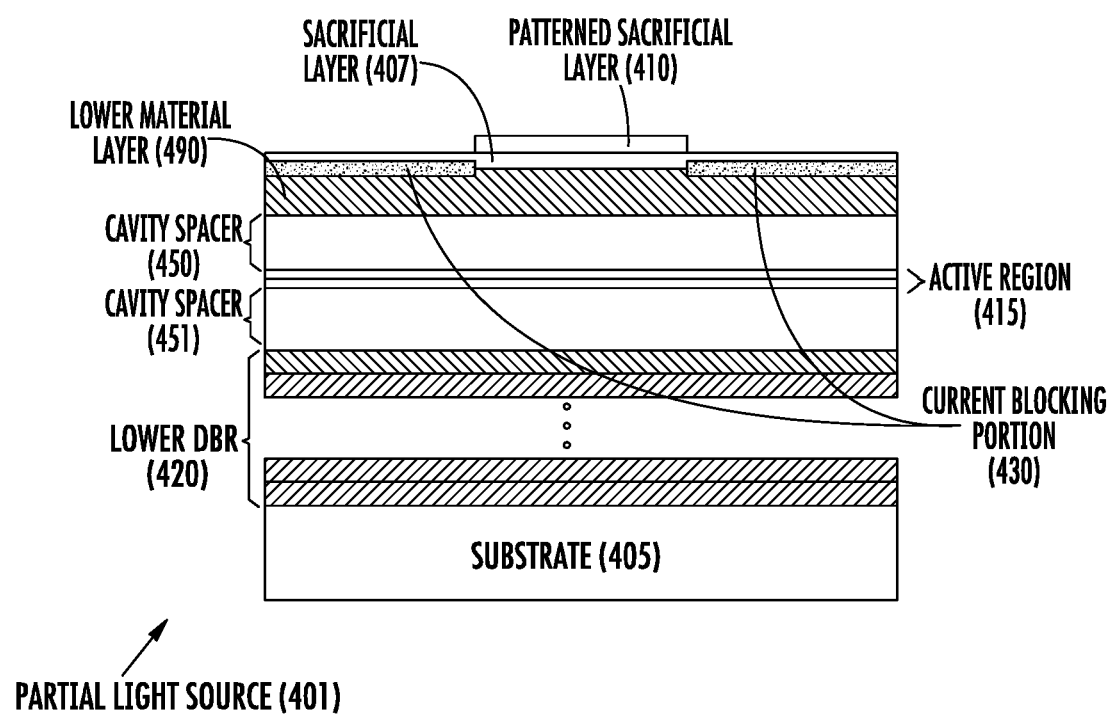
FIG. 4 shows a schematic cross sectional diagram of the partial epitaxial structure in FIG. 3B for which the plurality of sacrificial layers are used to define an index guide with $\Delta H > 0$ following epitaxial regrowth.

It is also noted that a ΔH value only slightly greater than zero may be created using the two layer sacrificial layer and selectively etching only the upper most sacrificial layer. FIG. 4 shows a schematic cross section of an example of a partial light source structure 401 to accomplish this. Shown in FIG. 4 are the substrate 405, the lower DBR 420, lower cavity spacer layer 451, active region 415, upper cavity spacer layer 450, lower material layer 490 that is Al-bearing upon which regrowth will be performed, an implanted current blocking portion 430, and sacrificial layers shown as an upper sacrificial layer 407 and a patterned sacrificial layer 410 on the upper sacrificial layer 407.

Following the regrowth procedure as before, a small but nonzero difference of ΔH will be obtained between the mode confining region and mode confined region following epitaxial regrowth. This is because there is greater thickness of the sacrificial layer where patterned sacrificial layer 410 remains. If the patterned sacrificial layer 410 comprises InGaAs or InGaAs with a graded compensation and sacrificial layer 407 is GaAs, a dilute citric acid/hydrogen peroxide etch can be used to selectively stop the etch on sacrificial layer 407. This is shown in FIG. 4 for which the patterned sacrificial layer 410 is patterned while the sacrificial layer 407 remains intact outside the patterned sacrificial layer 410. The sacrificial layer 407, patterned sacrificial layer 410, the lower material layer 490, and thermal etch conditions can be chosen to leave a mesa as shallow as ΔH≤10 Å on the crystal surface following crystal growth. Therefore ΔH and the mode confinement can be designed with a range of values of ΔH≥0 using the above-described techniques.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A semiconductor vertical resonant cavity light source (vertical light source), comprising:
   an upper mirror and a lower mirror that define ends of a vertical resonant cavity;
   an active region within said vertical resonant cavity for light generation;
   at least one cavity spacer region between said active region and said upper mirror or said lower mirror;
   an outer current blocking region and an inner mode confinement region within said outer current blocking region;
   an index guide in said inner mode confinement region between said cavity spacer region and said upper mirror or said lower mirror;
   wherein said index guide and said outer current blocking region each comprise a lower epitaxial material layer and an upper epitaxial material layer thereon with an epitaxial interface region in between;
   wherein said lower material layer comprises N atoms in said lower material layer Column V lattice sites at said interface region; and
   wherein at least a top surface of said lower material layer comprises an Al-comprising material in said interface region throughout a full area of an active part of said vertical light source.

2. The vertical cavity light source of claim 1, wherein said lower material layer has an Al composition between 5% and 50% of Column III lattice sites at said interface region.

3. The vertical cavity light source of claim 1, wherein said lower material layer has an Al composition between 15% and 35% of Column III lattice sites at said interface region.

4. The vertical cavity light source of claim 1, wherein an epitaxial step height (ΔH) between (i) a height of said epitaxial interface in said inner mode confinement region having said index guide minus (ii) a height of said epitaxial interface in said outer current blocking region is zero.

5. The vertical cavity light source of claim 1, wherein an epitaxial step height (ΔH) between (i) a height of said epitaxial interface in said inner mode confinement region having said index guide minus (ii) a height of said epitaxial interface in said outer current blocking region is between 10 Å and 400 Å.

6. The vertical cavity light source of claim 5, wherein said ΔH is 10 Å to 200 Å.

7. The vertical cavity light source of claim 1, wherein said lower material layer has an Al composition >90% of Column III lattice sites at said interface region.

8. A partial vertical cavity light source, comprising:
   a lower mirror that defines a bottom end of a partial vertical resonant cavity;
   an active region within said partial vertical resonant cavity for light generation;
   at least one cavity spacer region between said active region and said lower mirror;
   said partial vertical resonant cavity further comprising a lower material layer providing at least a portion of a top mirror for said vertical resonant cavity and at least one layer intended to be patterned to form an inner mode confinement region within an outer current blocking portion having an epitaxial interface region in between, wherein said intended to be patterned-layer is intended for later removal;
   wherein said lower material layer comprises N atoms in said lower material layer Column V lattice sites at said interface region; and
   wherein a top surface of said lower material layer comprises an Al-comprising material in said interface region throughout a full area of an active part of said partial vertical cavity light source.

9. The partial vertical cavity light source of claim 8, wherein said lower material layer has an Al composition between 5% and 50% of Column III lattice sites at said interface region.

10. The partial vertical cavity light source of claim 8, wherein said lower material layer has an Al composition between 15% and 35% of Column III lattice sites at said interface region.

11. The partial vertical cavity light source of claim 8, wherein said lower material layer has an Al composition greater than 90% of Column III lattice sites at said interface region.

12. The partial vertical cavity light source of claim 8, wherein said lower material layer has an Al composition greater than 90% of Column III lattice sites at said interface region.

13. The partial vertical cavity light source of claim 8, wherein said layer for later removal comprises a plurality of layers intended for later removal.

14. The partial vertical cavity light source of claim 13, wherein at least one of said plurality of layers includes indium (In).

15. A method for forming a semiconductor vertical cavity light source (vertical light source), comprising:
   forming a partial vertical light source, comprising forming:
      a lower mirror that defines one end of a vertical resonant cavity;
      an active region within said vertical resonant cavity for light generation;
      at least one cavity spacer region between said active region and said lower mirror;
      at least one epitaxial terminating layer over said cavity spacer region;
      a lower material layer that forms an epitaxial interface region with said terminating layer, wherein said lower material layer comprises N atoms in said lower material layer Column V lattice sites at said interface region and wherein at least a top surface of said lower material layer that adjoins said terminating layer comprises an Al-comprising material along said interface region;
   patterning said terminating layer to define at least one region intended to form index confining regions such that said terminating layer remains covering at least within said region intended to form said index confining regions;
   forming at least one current blocking portion for providing at least one outer current blocking region;
   placing said patterned partial vertical cavity light source into an epitaxial growth system, and then:
      thermal annealing to remove said terminating layers such that at least said top surface of said lower material layer that is Al-bearing in at least one area of said partial vertical cavity light source intended to form a full area of an active part of said partial vertical light source is exposed to an epitaxial growth ambient, and
      epitaxial growing to deposit at least one epitaxial upper material layer on said lower material layer, wherein said upper material layer and said lower material layer comprises an Al-bearing material in at least said top surface of said lower material layer at said interface region.

16. The method of claim 15, wherein said lower material layer has an Al composition between 5% and 50% of Column III lattice sites at said interface region.

17. The method of claim 15, wherein said lower material layer has an Al composition between 15% and 35% of Column III lattice sites at said interface region.

18. The method of claim 15, wherein an epitaxial step height ($\Delta H$) between (i) a height of said epitaxial interface in an inner mode confinement region having an index guide minus (ii) a height of said epitaxial interface in said outer current blocking region is zero.

19. The method of claim 15, wherein an epitaxial step height ($\Delta H$) between (i) a height of said epitaxial interface in said inner mode confinement region having said index guide minus (ii) a height of said epitaxial interface in said outer current blocking region is between 10 Å and 400 Å.

20. The method of claim 15, wherein an epitaxial step height ($\Delta H$) between (i) a height of said epitaxial interface in said inner mode confinement region having said index guide minus (ii) a height of said epitaxial interface in said outer current blocking region is 10 Å to 200 Å.

21. The method of claim 15, wherein said lower material layer has an Al composition >90% of Column III lattice sites at said interface region.

* * * * *